United States Patent [19]

Mattfeld

[11] 4,227,156
[45] Oct. 7, 1980

[54] CIRCUIT FOR AT LEAST TWO FREQUENCIES

[75] Inventor: Johann Mattfeld, Flein, Fed. Rep. of Germany

[73] Assignee: Licentia Patent-Verwaltungs-G.m.b.H., Frankfurt am Main, Fed. Rep. of Germany

[21] Appl. No.: 960,785

[22] Filed: Nov. 15, 1978

[30] Foreign Application Priority Data

Dec. 1, 1977 [DE] Fed. Rep. of Germany ....... 2753578
Jun. 27, 1978 [DE] Fed. Rep. of Germany ....... 2828090

[51] Int. Cl.² .......................... H03F 3/68; H04B 1/06
[52] U.S. Cl. .................................. 330/126; 330/174; 333/133; 333/189; 455/144
[58] Field of Search ............... 330/126, 174, 302, 306; 325/315, 317, 316; 333/132, 133, 189

[56] References Cited

U.S. PATENT DOCUMENTS

3,949,307  4/1976  Klank et al. ..................... 325/317 X

*Primary Examiner*—James B. Mullins
*Attorney, Agent, or Firm*—Spencer & Kaye

[57] ABSTRACT

A circuit for at least two frequencies comprises a high frequency filter and a low frequency filter and a pair of series connected terminating resistors, the high frequency filter being connected to a first terminating resistor and directly to a common circuit point, the low fequency filter being connected to the connection between the two resistors and the order of magnitude of the terminating resistors being the same as the order of magnitude of the required terminating resistance of the filters.

11 Claims, 2 Drawing Figures

CIRCUIT FOR AT LEAST TWO FREQUENCIES

BACKGROUND OF THE INVENTION

The invention relates to a circuit which is operated alternately with at least two frequencies carried by a common connection while using filters.

For example, intermediate frequency amplifiers with amplitude-modulated and frequency-modulated signals are used in radio receivers. Only a single amplifier should be used for AM and FM owing to the cost. Thus when using electrical filters with transformers, the coupling windings of the two transformers are connected in series and this series connection is connected to the input connection of the IF amplifier. When operating the IF amplifier at one or the other frequency, the secondary winding of the filter, which is not in operation and is connected in series with the secondary winding of the active transformer, is so low in resistance that the series resistance caused thereby in each case is negligibly small.

When using ceramics filters the principle of connection mentioned cannot easily be used because the transmission characteristics of the ceramic filters are only guaranteed when terminating them with the desired terminating resistance. Ceramics filters were therefore only used, for a long time, when the respective filter required was connected separately to the input or to the output of an amplifier during frequency change with the aid of an additional switch.

SUMMARY OF THE INVENTION

It is an object of the invention to provide a connection in which an additional switch can be dispensed with when changing frequency.

According to the invention, there is provided a circuit for at least two frequencies comprising a high frequency filter, a lower frequency filter, a first terminating resistor connected to said high frequency filter and of the same order of magnitude as the required terminating resistance of said high frequency filter, a second terminating resistor connected in series with said first terminating resistor and to said lower frequency filter at a connection point between said first and second terminating resistors and of the same order of magnitude as the required terminating resistance of said lower frequency filter and means connecting said high frequency filter directly to a circuit point common to both frequencies.

Further according to the invention, there is provided a circuit which is operated alternately with at least two frequencies through a common connection, and using filters, characterized in that the filters are ceramic; that two terminating resistors each connected to a filter, are connected in series with the lower frequency filter connected to the connection point between the two resistors, and the higher frequency filter connected to the lower value resistor of said two resistors and is connected directly to the common circuit connection for both frequencies; and that the order of magnitude of said resistors corresponds to the order of magnitude of the required terminating resistance required for the ceramic filters.

BRIEF DESCRIPTION OF THE DRAWINGS

The invention will now be described in greater detail, by way of example, with reference to the drawing,
FIGS. 1 and 2 of which are a circuit diagrams of two embodiments of the inventio.

DESCRIPTION OF THE PREFERRED EMBODIMENTS

Figure 1:
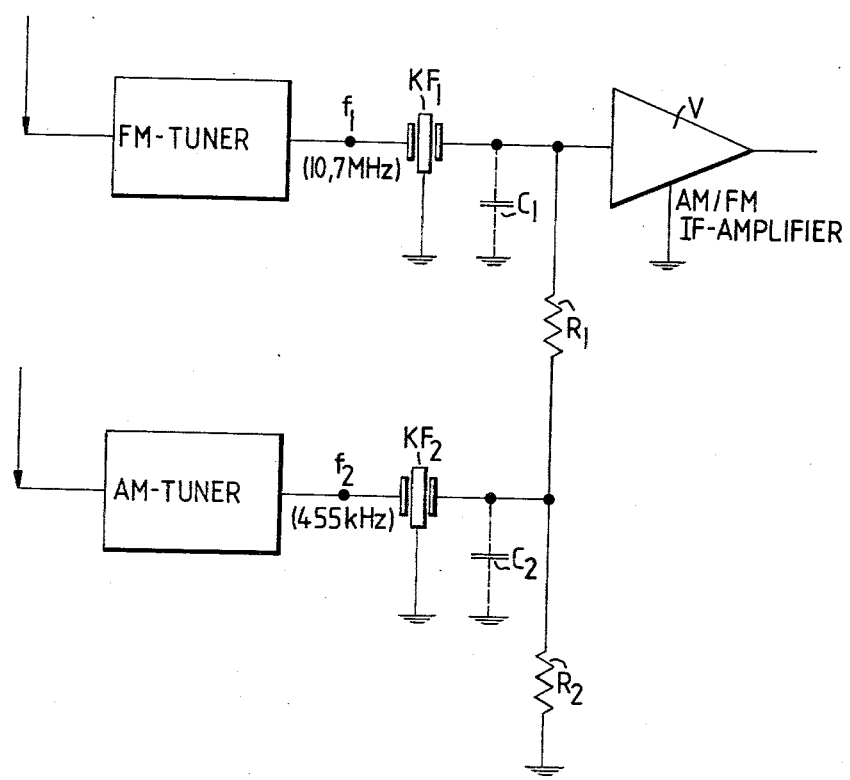

In a preferred embodiment of the invention, FIG. 1 shows a circuit using as stated at the outset, ceramics filters. Two terminating resistors connected to a filter in each case are connected in series, with the lower frequency filter being connected to the connection point between the two resistors while the higher frequency filter is connected to the lower value resistor of the two resistors and directly to the common circuit connection which is provided for both frequencies. The resistors correspond in terms of their order of magnitude to the terminating resistors required for the ceramics filters.

In order to match the filter circuit to the permitted input load of subsequent amplifiers or in order to avoid oscillations in the circuit, it may be necessary to deviate from the desired terminating resistances of the ceramics filters slightly when selecting the terminating resistors $R_1$ and $R_2$.

In accordance with the present invention, it has been shown that the resistors $R_1$, $R_2$ preferably have a third of to twice the value of the desired terminating resistance of the associated and subsequent ceramic filter.

Thus ceramic filters are used in which the higher frequency filter has the lowest possible output capacitance and a low value terminating resistance, while the lower frequency filter is provided with the largest possible output capacitance and a high ohmic terminating resistance. The series connection of two resistors is connected, for example, between the input or the output or an amplifier circuit and a potential connection which is common to the amplifier. For this potential connection the earth connection may be used for example. The principle of the connection in accordance with the invention can be used for example in intermediate freqeuncy amplifiers which process both amplitude-modulated and frequency- modulated signals. It is also conceivable for the filter circuit in accordance with the invention to be connected after the output of an amplifier and for the individual filters to be connected to an FM or AM demodulator in each case.

In FIG. 1, an AM/FM IF amplifier V is shown which is to be used in order to amplify both the AM signal and the FM signal without additional switches. In the FM tuner which is assembled from an input stage, a mixing stage and an oscillator, the frequency $f_1$ is produced which amounts, for example, to 10.7 MHz. In the AM tuner which comprises equivalent circuit elements, the lower frequency $f_2$ is produced and is, for example, 455 kHz. The frequency $f_1$ is passed to the input of a ceramics filter $KF_1$ and the frequency $f_2$ is passed to the input of a ceramics filter $KF_2$. The output of the filter $KF_1$ is connected to the input of the IF amplifier and to a resistor $R_1$. The output of the filter $KF_2$ is also connected to the resistor $R_1$ and to a resistor $R_2$. The free connection of the resistor $R_2$ is applied to earth, for example. Furthermore, the output capacitances $C_1$ and $C_2$ inherent in the filter are shown in the Figure in broken lines. The higher frequency filter $KF_1$ requires a certain desired terminating resistance which is 300Ω for example. The resistor $R_1$ has the value $R_1 = 150Ω$ in a preferred embodiment. The resistor $R_2$ corresponds largely to the desired terminating resistance of the lower frequency filter $KF_2$ which is 2 kΩ for example.

It has been shown that the higher frequency filter $KF_1$ has a relatively small output capacitance $C_1$. This output capacitance $C_1$ is of the order of magnitude of 15 to 20 pF, for example. On the other hand the lower frequency filter $KF_2$ has a relatively large output capacitance $C_2$ which is of the order of magnitude of 500 pF for example.

If the IF amplifier V is triggered by the higher frequency $f_1$, the filter $KF_1$ is almost correctly terminated despite the series connection of resistors $R_1$ and $R_2$, because the connecting point between the resistors $R_1$ and $R_2$ is connected, in a sufficiently low resistance manner for the frequency $f_1$, to earth via the output capacitance of the filter $KF_2$. The capacitance $C_2$ of a magnitude approximately 500 pF forms an extremely low resistance bridge in respect of resistor $R_2$ for a frequency $f_1 = 10.7$ MHz, so that this resistor $R_2$ is almost without effect.

When operating the IF amplifier at the relatively low frequency $f_2$, the filter $KF_2$ is also terminated largely correctly if the resistor $R_2$ largely corresponds to the desired terminating resistance of the filter $KF_2$. This is due to the fact that the alternating current resistance is relatively large across the capacitance $C_1$ of the filter $KF_1$ for the frequency $f_2$ with a small capacitance value $C_1$ of the order of magnitude of 20 pF, so that a negligibly small current only can flow through the current path $R_1 C_1$. Since the input impedance of the amplifier V is also of high resistance, this resistance only has a slightly disruptive effect on the termination of the ceramics filter $KF_2$. In any case, insignificantly small corrections would be necessary and thus, with a desired terminating resistance of 2 k$\Omega$ for the ceramics filter $KF_2$, the resistor $R_2$ is selected with a value of 2.2 k$\Omega$. The filter $KF_2$ is then terminated by the correct resistance if the high value resistors of the amplifier V and of the current path, which are connected in parallel to $R_2$, are taken into account via the capacitor $C_1$.

Figure 2:
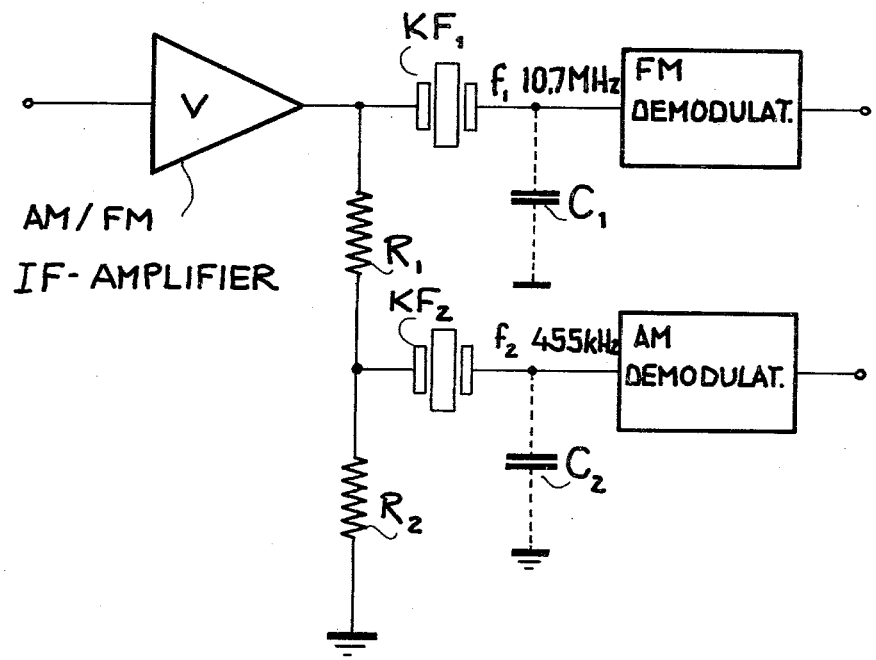

Reference has already been made to the fact that the circuit arrangement shown can, as shown in FIG. 2, be usefully connected also to the output of an amplifier. This is the case, for example, when the two frequencies at the output of the amplifier have to be selected for further processing in separate demodulators. The arrangement of the filter circuit in accordance with the invention can also be connected between individual amplifier stages.

It will be understood that the above description of the present invention is susceptible to various modification changes and adaptations.

What is claimed is:

1. A circuit which is operated alternately with at least two frequencies through a common connection, and using filters, characterized in that the filters are ceramic; that two terminating resistors, each connected to a filter, are connected in series with the lower frequency filter connected to the connection point between the two resistors, and the higher frequency filter connected to the lower value resistor of said two resistors and is connected directly to the common circuit connection for both frequencies; and that the order of magnitude of said resistors corresponds to the order of magnitude of the required terminating resistance required for the ceramic filters.

2. A circuit as defined in claim 1, wherein the values of said resistors are between one-third and twice the value of the desired terminating resistor of the ceramic filter connected thereto and associated therewith.

3. A circuit as defined in claim 1, wherein said series connection of said two resistors is connected between the input of an amplifier circuit and a potential connection which is common to said amplifier.

4. A circuit as defined in claim 3, wherein said series connection of said two resistors is connected between said input of said amplifier circuit and earth potential.

5. A circuit as defined in claim 3, wherein said amplifier is an AM/FM IF amplifier.

6. A circuit as defined in claim 1, wherein said higher frequency filter has a low output capacitance and a low value terminating resistor and said lower frequency filter has a large output capacitance and a higher value terminating resistor.

7. A circuit as defined in claim 1, wherein said higher frequency filter has a desired terminating resistance of approximately 300$\Omega$ and is connected to said lower value resistor of approximately 150$\Omega$, and the value of said higher value resistor corresponds to the desired terminating resistance of said lower frequency filter of approximately 2 k$\Omega$.

8. A circuit as defined in claim 1, wherein said series connection of said two resistors is connected between the output of an amplifier circuit and a potential connection which is common to said amplifier.

9. A circuit as defined in claim 8, wherein said series connection of said two resistors is connected between said output of said amplifier circuit and earth potential.

10. A circuit as defined in claim 8, wherein said amplifier is an AM/FM IF-amplifier.

11. A circuit for at least two frequencies comprising a high frequency filter, a lower frequency filter, a first terminating resistor connected to said high frequency filter and of the same order of magnitude as the required terminating resistance of said high frequency filter, a second terminating resistor connected in series with said first terminating resistor and to said lower frequency filter at a connection point between said first and second terminating resistors and of the same order of magnitude as the required terminating resistance of said lower frequency filter and means connecting said high frequency filter directly to a circuit point common to both frequencies.

* * * * *